United States Patent
Warner

(10) Patent No.: US 7,830,743 B2
(45) Date of Patent: Nov. 9, 2010

(54) SEQUENTIAL ACCESS MEMORY METHOD

(75) Inventor: David J. Warner, Addlestone (GB)

(73) Assignee: Aptina Imaging Corporation, George Town (KY)

( * ) Notice: Subject to any disclaimer, the term of this patent is extended or adjusted under 35 U.S.C. 154(b) by 90 days.

(21) Appl. No.: 12/353,070

(22) Filed: Jan. 13, 2009

(65) Prior Publication Data
US 2009/0122629 A1  May 14, 2009

Related U.S. Application Data

(63) Continuation of application No. 10/923,306, filed on Aug. 20, 2004, now Pat. No. 7,477,570.

(51) Int. Cl.
G11C 8/00 (2006.01)

(52) U.S. Cl. .................. 365/239; 365/203; 365/230.02; 365/189.02; 365/189.17

(58) Field of Classification Search .................. 365/239, 365/203, 230.02, 189.02, 189.17
See application file for complete search history.

(56) References Cited

U.S. PATENT DOCUMENTS

| | | | |
|---|---|---|---|
| 5,027,326 A | 6/1991 | Jones | |
| 5,253,203 A | 10/1993 | Partovi et al. | |
| 5,280,449 A | 1/1994 | Oldham | |
| 5,381,363 A | 1/1995 | Bazes | |
| 5,479,370 A | 12/1995 | Furuyama et al. | |
| 5,535,170 A | 7/1996 | Imamura et al. | |
| 5,612,926 A | 3/1997 | Yazawa et al. | |
| 5,636,174 A | 6/1997 | Rao | |
| 5,699,087 A | 12/1997 | Krenik et al. | |
| 5,831,924 A * | 11/1998 | Nitta et al. | 365/189.17 |
| 5,848,015 A | 12/1998 | Seno | |
| 5,995,430 A | 11/1999 | Yabe | |
| 6,098,145 A | 8/2000 | Huang | |
| 6,249,482 B1 | 6/2001 | Albon et al. | |
| 6,327,192 B1 | 12/2001 | Lee | |
| 6,792,502 B1 | 9/2004 | Pandya et al. | |
| 7,460,432 B2 | 12/2008 | Warner | |
| 7,477,570 B2 | 1/2009 | Warner | |
| 2002/0163848 A1 | 11/2002 | Grasso | |
| 2004/0252201 A1 | 12/2004 | Meitav et al. | |
| 2005/0041806 A1 | 2/2005 | Pinto et al. | |

* cited by examiner

Primary Examiner—Thong Q Le

(57) ABSTRACT

A sequential access memory ("SAM") device, system and method is provided that includes a memory array configured to store a group of bytes on each of a plurality of rows. A plurality of bit-lines transfer each of the group of bytes into and out of the memory array, and a pre-charging unit is configured to pre-charge the plurality of bit-lines once per each transfer of one of the group of bytes into or out of one of the plurality of rows. The device operates by accessing a memory array in a SAM device by activating a selected row in the memory array, pre-charging a plurality of bit-lines that provide access to the memory array, and accessing the memory array before the plurality of bit-lines are pre-charged a second time.

9 Claims, 15 Drawing Sheets

SEQUENTIAL ACCESS MEMORY METHOD

CROSS-REFERENCE TO RELATED APPLICATION

This application is a continuation of application Ser. No. 10/923,306, filed Aug. 20, 2004, now U.S. Pat. No. 7,477,570, issued Jan. 13, 2009.

BACKGROUND OF THE INVENTION

Technical Field

The present invention relates to memories, and more particularly, to sequential access memories with address pointers.

An important consideration in the design of complementary metal oxide semiconductor ("CMOS") devices or charge-coupled devices ("CCD") used for imaging applications, such as digital cameras or camcorders, is the efficient use of power. Limiting the power consumption of such CMOS devices or CCDs can result in increased battery life. Limited power consumption can also aid in the reduced generation of heat, a factor especially important in limiting dark current in imaging devices. Dark current, a type of noise that occurs in light-sensitive detectors, may be lessened by operation at low temperatures.

One significant source of power consumption in an imaging device is the pre-charging of bit-lines. Many imaging devices utilize static random access memory ("SRAM") arrays to which data may be written or from which data may be read. Data is often written to or read from the arrays in eight- to ten-bit bytes. However, prior to the read/write operation, the bit-lines i.e., the lines on which the bits are posted, are pre-charged, for example, to a high state, thus removing any residual signal on the bit-lines and fully preparing the bit-lines for the read/write operation. The pre-charge transitions require power to charge and discharge the capacitance associated with each bit-line. Because pre-charging is typically done before any read/write operations involving the SRAM, pre-charging occurs frequently, thus resulting in significant power consumption.

Generally, imaging CMOS devices and CCDs have used random access memory ("RAM") to store the data bytes. However, sequential access memory ("SAM") devices may also be used. SAM devices function by reading and writing data in a sequential manner—the memory array is linearly searched from a set start point until the desired memory address is found. A major limitation of SAM devices, however, is the fact that data read/write times are dependent on the location of the memory address along the linear search path. An audio tape provides a good example of this limitation. Assuming the tape is at its beginning, one can readily listen to the first part of the tape. However, the tape will need to be fast-forwarded to listen to later portions of the tape. This fast-forward process can become very inefficient, especially if the most accessed memory is not near the start point. On the other hand, read/write operations near the start point can be performed very quickly.

FIG. 1 comprises a block diagram of a conventional SAM device 34. The SAM device 34 is comprised of a memory block 10 and an address block 12. In FIG. 1, the memory block 10 consists of an "m by n" array of memory cells 14, each capable of storing one k-bit word or byte. The address block 12 consists of a row address pointer 16 and a column address pointer 18. The row address pointer 16 and the column address pointer 18 each contain a logic block 20, 21 to direct data through an appropriate registrar 22, 23 to or from the specified memory cell 14 in the memory block 10. A write-data bus 24 carries data to the SAM device 34. Data on the write-data bus 24 is parsed into k-bit words by a de-multiplexer 26 and then directed via a bit-line 28 to the appropriate memory cell 14 by both the row address pointer 16 and the column address pointer 18. Similarly, data leaves the SAM device 34 by traveling on the respective bit-lines 28 through a multiplexer 30 which assimilates the data for transmission on a read-data bus 32.

In contrast to SAM, RAM searches in multiple dimensions for a desired memory address. As a result, the time needed to access data is independent of the data's location on the memory array. For many devices, RAM is preferred over SAM for its increased flexibility and overall faster search times. However, SAM is still used when read/write operations can predictably benefit from the sequential search method.

One example of a class of devices that benefits from the SAM technology is digital signal processing devices. Most notably, digital cameras and camcorders, TV receivers, facsimile devices and copiers all may require the reading and writing of a fixed number of data bytes. Additionally, data bytes may be written and read in a sequential order, thus avoiding the potential limitations of SAM devices.

FIG. 2 illustrates how both SAM and RAM devices conventionally require an initializing pre-charge of the device bit-lines. FIG. 2 shows four related timing diagrams 36, namely diagrams depicting a clock signal 44, a pre-charge signal 46, a read-data signal 48, and a write-data signal 50. As shown, a pre-charge pulse 38 which acts to charge the device bit-lines occurs prior to every read operation 40 or write operation 42. Each pre-charge pulse 38 and subsequent read operation 40 or write operation 42 corresponds with a pulse of the clock signal 44. It should be noted that, although the read-data signal 48 and the write-data signal 50 are both shown on FIG. 2 for comparison purposes, the read-data signal 48 and write-data signal 50 do not necessarily occur at the same time.

The present invention addresses the mitigation of the negative effects of frequent pre-charging in an imaging CMOS or CCD application that utilizes some of the advantages of SAM devices over RAM devices.

SUMMARY OF THE INVENTION

The present invention comprises a sequential access memory device that includes a memory array configured to store a group of bytes on each of a plurality of rows, a plurality of bit-lines for transferring each of the group of bytes into and out of the memory array, and a pre-charging unit configured to pre-charge the plurality of bit-lines once per each transfer of one of the group of bytes into or out of one of the plurality of rows of the memory array. The sequential access memory device further includes an address unit configured to provide a row select signal to select a predetermined row of the plurality of rows by which one of the group of bytes may be transferred into or out of the memory array. The row select signal selects a row of the plurality of rows prior to the pre-charging of the plurality of bit-lines.

The present invention also comprises an electronic system, comprising an input device, an output device, a memory system, and a processor device coupled to the input device, the output device and the memory system. At least one of the input, output, memory and processor devices includes a sequential access memory device. The sequential access memory device includes a memory array configured to store a group of bytes on each of a plurality of rows, a plurality of bit-lines used to transfer each of the group of bytes into and out of the memory array, and a pre-charging unit configured to pre-charge the plurality of bit-lines once per each transfer of one of the group of bytes into or out of one of the plurality of rows of the memory array.

The present invention further includes an imaging system, comprising an optical system, an imaging device, a memory system, and a processor device coupled to the imaging device and the memory system. At least one of the imaging, memory and processor devices includes a sequential access memory device. The sequential access memory device includes a memory array configured to store a group of bytes on each of a plurality of rows, a plurality of bit-lines used to transfer each of the group of bytes into and out of the memory array, and a pre-charging unit configured to pre-charge the plurality of bit-lines once per each transfer of one of the group of bytes into or out of one of the plurality of rows of the memory array.

The present invention further comprises a semiconductor substrate on which a sequential access memory device is fabricated. The sequential access memory device includes a memory array configured to store a group of bytes on each of a plurality of rows, a plurality of bit-lines for transferring each of the group of bytes into and out of the memory array, and a pre-charging unit configured to pre-charge the plurality of bit-lines once per each transfer of one of the group of bytes into or out of one of the plurality of rows of the memory array.

The present invention further includes a method of accessing a memory array in a sequential access memory device. A selected row is activated in the memory array through use of an address unit row pointer, wherein the selected row is configured to store a group of bytes in a corresponding group of memory cells. A plurality of bit-lines is pre-charged to provide access to the group of memory cells. Each of the group of memory cells is accessed before the bit-lines are pre-charged a second time.

The present invention further includes a method of operating an imaging system, wherein the imaging system includes at least one sequential access memory device. An image of light or other incident energy is captured upon a two-dimensional sensor array of pixel elements within an imaging device. The pixel data is then transferred from the sensor array to a memory array within the at least one sequential access memory device. The transfer of pixel data is achieved by the initial activation of a selected row in the memory array through use of an address unit row pointer, wherein the selected row is configured to store a group of bytes in a corresponding group of memory cells. A plurality of bit-lines is pre-charged to provide access to the group of memory cells. Each of the group of memory cells is accessed before the bit-lines are pre-charged a second time.

BRIEF DESCRIPTION OF THE DRAWINGS

Embodiments of the present invention will now be described, by way of example only, with reference to the following drawings in which.

DETAILED DESCRIPTION OF THE INVENTION

Figure 1:
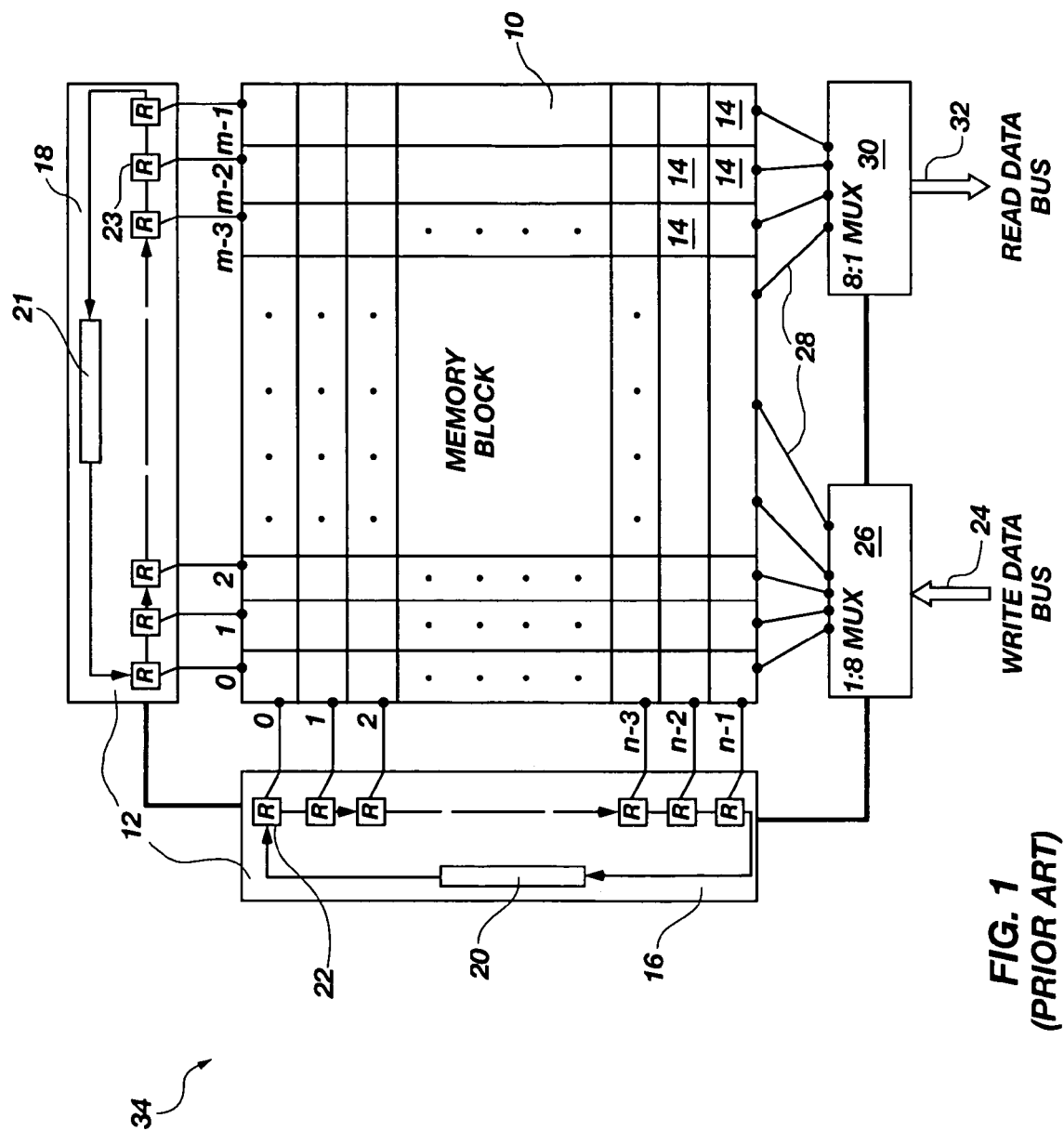
FIG. 1 is a simplified block diagram of a conventional sequential access memory device, including a memory array and address pointers.
Figure 2:
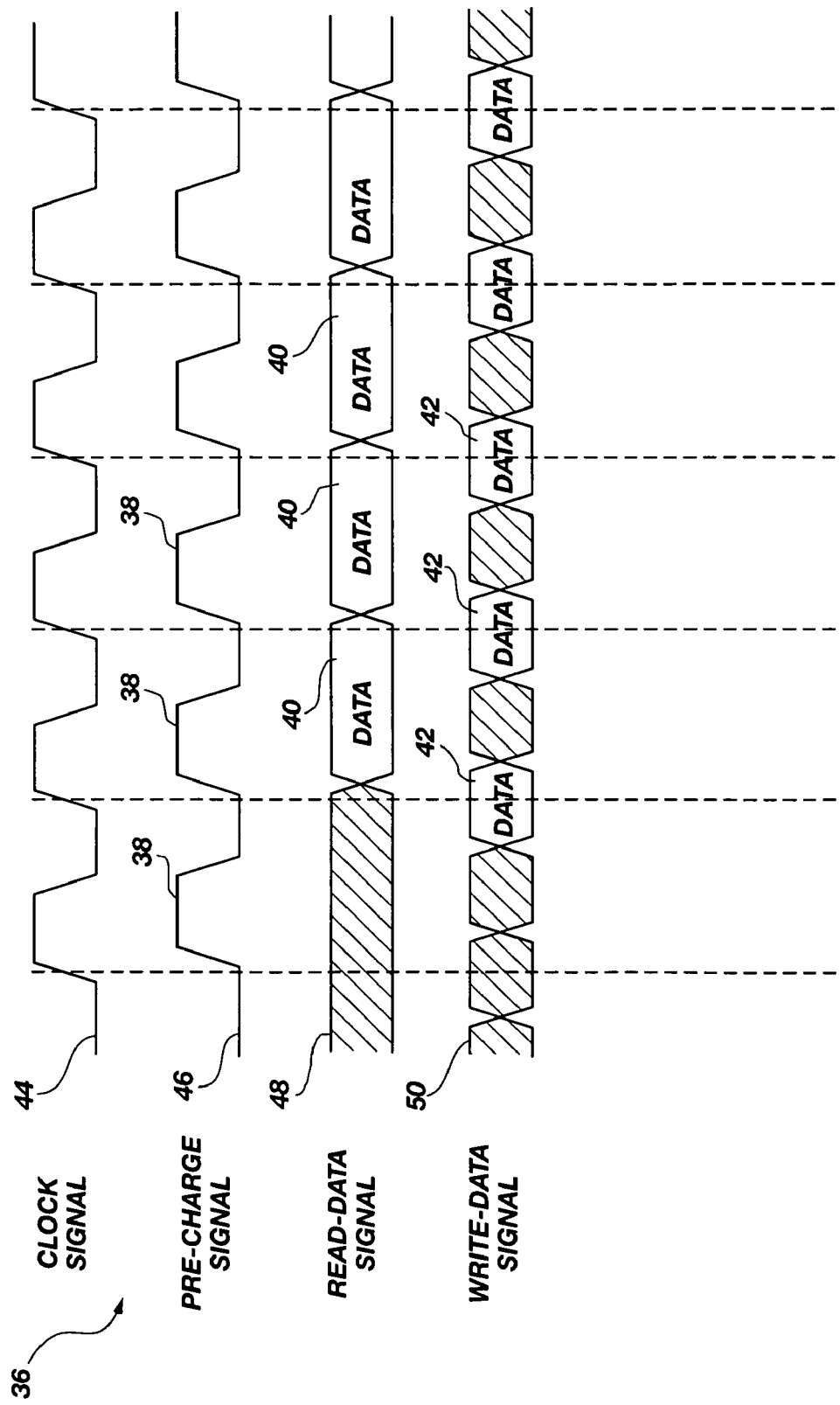
FIG. 2 is a timing diagram for the conventional SAM device of FIG. 1, indicating the rate of pre-charge pulses present for each read or write operation.

The present invention is described by reference to the associated drawing figures. Identical labels and numbers in multiple drawing figures are meant to represent the same elements in each drawing figure. Certain terms are used throughout and have meanings identified below, unless otherwise specified.

The term "sequential access memory" refers to a device that includes a memory array, memory cells of which may be accessed in a sequential manner. Such a device also includes appropriate logic to implement a sequential access scheme utilizing, for example, address pointers.

The terms "multiplexer" or "mux" refers to a device that can either place data from multiple sources onto a single bus line, or place data from a single bus line onto various bit-lines. Address pointing signals directed to the mux indicate the correct source or target bit-line. For example, the term "mux 8:1" refers to a device that takes data from one of eight different sources and places it onto a single bus line. The term "mux 1:8" refers to a device that takes data from a single bus line and places it onto one of eight different target bit-lines.

The term "inverter" refers to a device that inverts or "flips" an incoming signal to a signal that is the opposite of the incoming signal. For example, a logical high signal would be inverted to a logical low signal as it passes through an inverter.

The term "buffer" refers to a sequential even number of inverters.

The term "3-bit binary ripple counter" refers to a circuit which has a clock input and eight count outputs corresponding to eight clock cycles. The output may change either on rising or falling clock edges. The circuit may also have a reset input which sets all outputs to zero when asserted.

The term "clock generator" refers to a circuit which, when enabled by an appropriate signal, either creates a clock signal or passes a clock signal.

The term "clock delay" refers to a circuit which temporally delays and outputs a temporally delayed clock signal.

The term "D flip-flop" refers to a device that, when clocked on the active edge, stores the present state or value of the bit-line to which it is connected.

The term "shift register" refers to a clocked bit-sequential storage device where a clock cycle causes the value stored in one bit position to move to the next. The "first" bit position often accepts new external values. Any of the bit positions might be read. As a clarifying example, two shift registers can be cascaded into a larger shift register by connecting the output value of the "last" bit position of one shift register into the input value into the "first" bit position of the second shift register, thus creating a "2-bit shift register." A "1-bit shift register" only includes a single shift register.

The term "tri-state inverter" refers to an inverter that may be enabled. When enabled, it acts like a regular inverter. When not enabled, however, the tri-state inverter's output is turned off; if looking into the output from the device, it would appear as an open circuit.

The term "memory cell" refers to a storage unit of a memory array. A memory cell can store a byte or word of data of "k" bits. Hence, a memory cell will be comprised of "k" bit cells.

The term "bit cell" refers to a one-bit storage unit of a memory cell.

Figure 3:
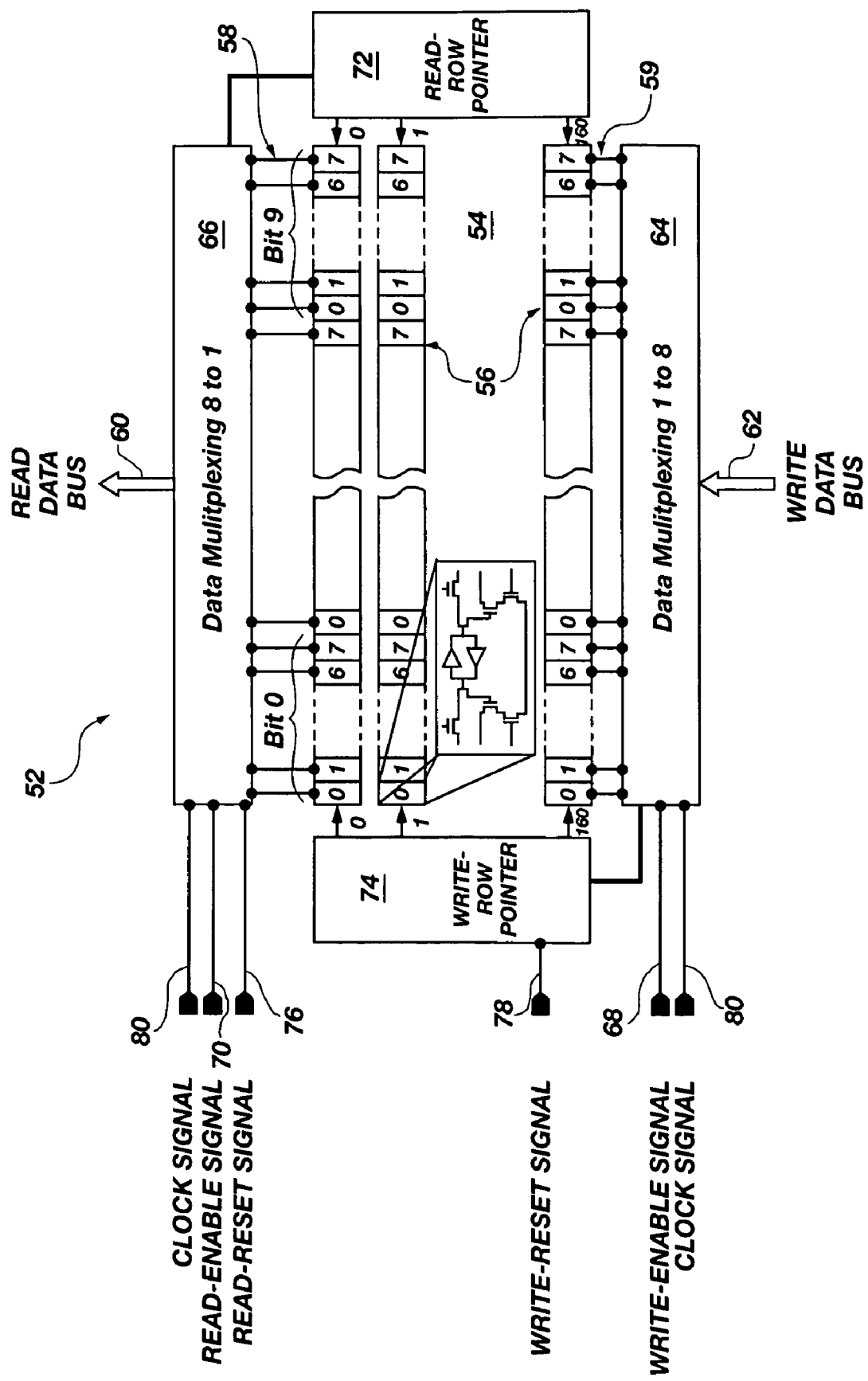
FIG. 3 is a simplified block diagram of a sequential access memory device in accordance with an embodiment of the present invention.

FIG. 3 is a simplified block diagram of a sequential access memory (SAM) device 52, in accordance with an embodiment of the present invention. A sequential access memory device may be configured to store a plurality of bits per row of memory storage. By way of example and not limitation, an exemplary sequential access memory device includes a memory array 54 configured for storing, for example, 80 bits per row on 161 rows. If each stored byte is, for example, 10 bits, then the memory array 54 is capable of storing 1288 bytes, at 8 bytes per row. The bits are transferred to appropriate memory cells 56 via write bit-lines 59 that connect the memory array 54 with either a read-data bus 60 or a write-data bus 62. For the present example, a bank of 1:8 multiplexers 64 for the write-data bus 62 and a bank of 8:1 multiplexers 66 for the read-data bus 60 may be enabled via a write-enable signal 68 or a read-enable signal 70 to allow data to flow to or from the appropriate columns of the memory array 54 through the write bit-lines 59 or the read bit-lines 58, respectively. Additionally, two row pointers, a read-row pointer 72 and a write-row pointer 74, operate to allow data to flow to or from the appropriate rows of the memory array 54 through the write bit-lines 59 or the read bit-lines 58, respectively. A read-reset signal 76 and a write-reset signal 78 act to reset the read-row pointer 72 and the write-row pointer 74, respectively. Finally, a clock signal 80 is input to the SAM device 52.

SAM device 52 may be used, for example, to transfer pixel data from an imaging array. Continuing with the current example, the imaging array has a line width of 1288 pixels. The analog value of each pixel is converted to a 10-bit digital value, creating a 10-bit byte. Thus, the SAM device 52 can effectively store an entire line of pixel data. Because each line of pixel data may be written and read sequentially, the device may utilize sequential access memory. Furthermore, since a complete memory array row of data will be written before the data is required to be read, the frequency of pre-charging for write operations may be reduced to, for example, only once every eight write byte operations. In other words, the device may pre-charge the write bit-lines 59 prior to writing to a row of the memory array 54, and the device will not need to pre-charge again until the next row is ready to be written.

Figure 4:
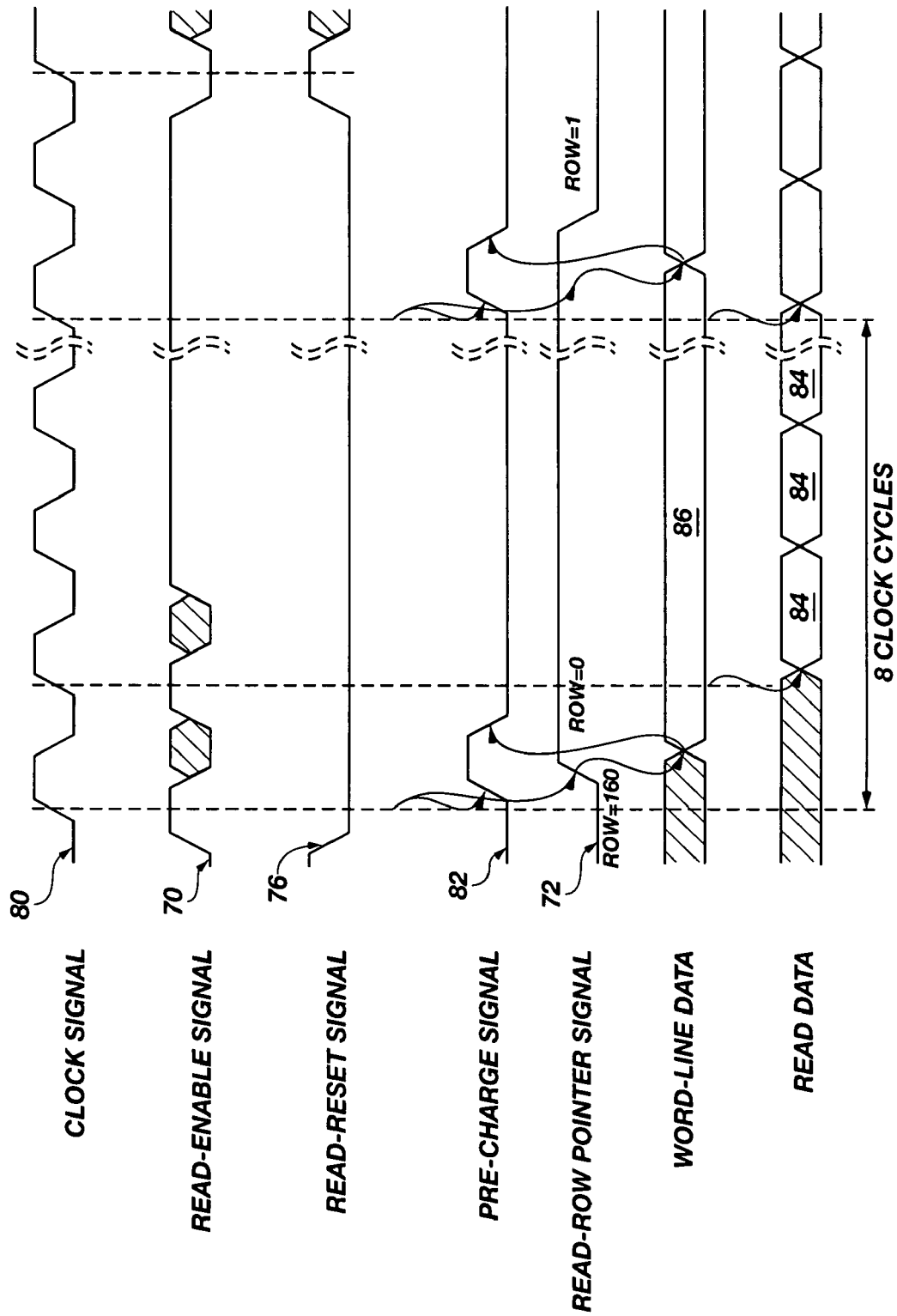
FIG. 4 is a timing diagram illustrating a reduced pre-charge rate during a read operation, in accordance with an embodiment of the present invention.

FIG. 4 is a timing diagram illustrating a reduced pre-charge rate during a read operation, in accordance with an embodiment of the present invention. Continuing with the current example, eight bytes 84 or one word-line 86 may be read for every one pre-charge signal. Upon activation of the read-reset signal 76, the read-row pointer 72 is reset to point to row160 of the memory array 54 (FIG. 3). Then, upon activation of the read-enable signal 70, the read-row pointer 72 shifts to row0 for the initial read operation. Also upon activation of the read-enable signal 70, the read bit-lines 58 are pre-charged via activation of the pre-charge signal 82. Eight words or bytes 84 are then read before the read bit-lines 58 (FIG. 3) are pre-charged again and the read-row pointer 72 is shifted to the next row.

Figure 5:
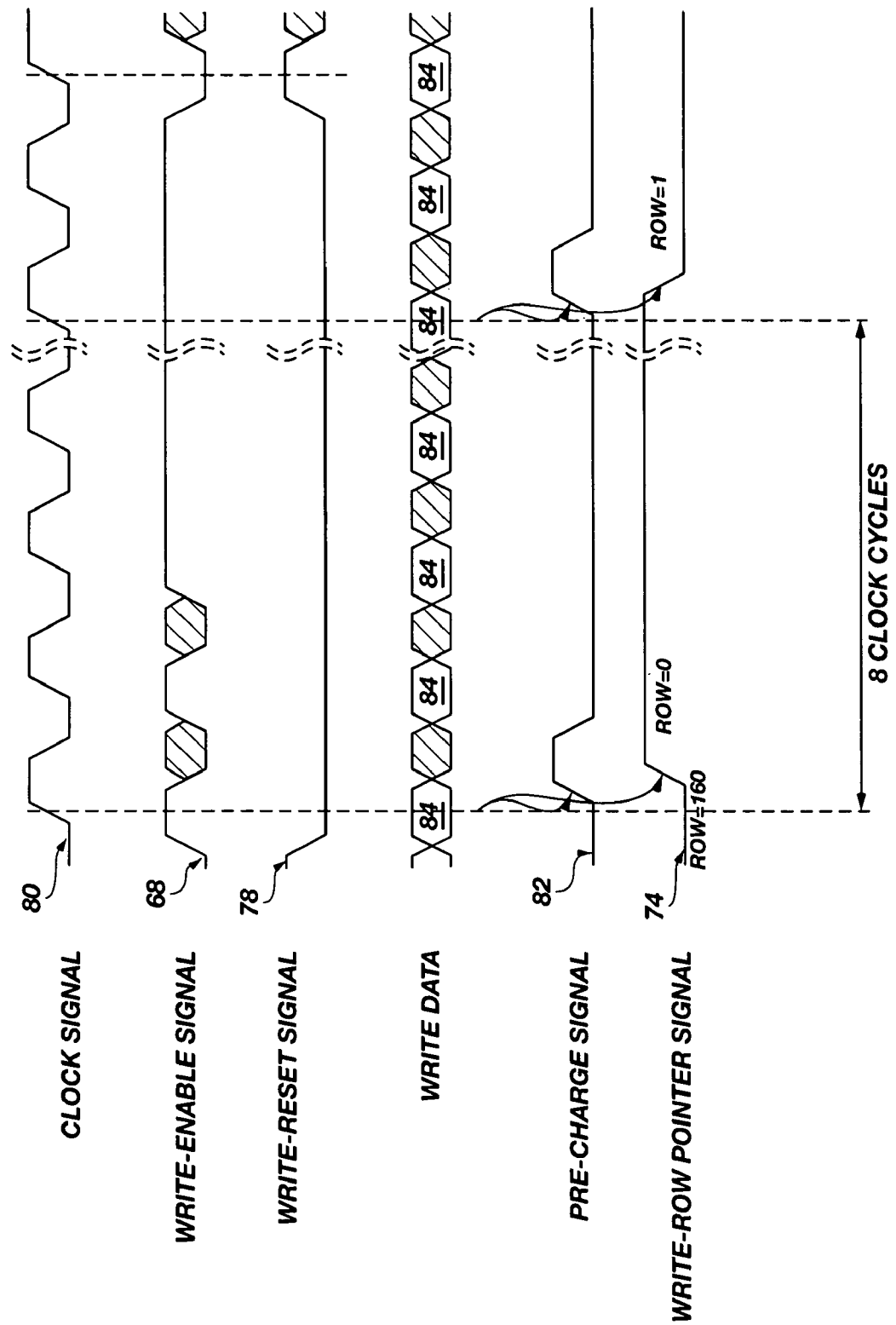
FIG. 5 is a timing diagram illustrating a reduced pre-charge rate during a write operation, in accordance with an embodiment of the present invention.

FIG. 5 is a similarly detailed timing diagram illustrating a reduced pre-charge rate during a write operation, in accordance with an embodiment of the present invention. Because write operations are also sequential, the write bit-lines 59 need only be pre-charged once every eight written words or bytes 84. FIG. 5 depicts the activation of the write-reset signal 78 and the resultant resetting of the write-row pointer 74 to row160. Then, when the write-enable signal 68 is activated, the write-row pointer 74 is shifted to row0, and the write bit-lines 59 (FIG. 3) are pre-charged by the activation of the pre-charge signal 82. Eight words or bytes 84 are written for every pre-charge signal 82 activation. After eight words or bytes 84 are written, the write-row pointer 74 is incremented to the next row. The overall results of fewer read and write pre-charges are less consumption of power and reduced generation of heat.

Figure 6:
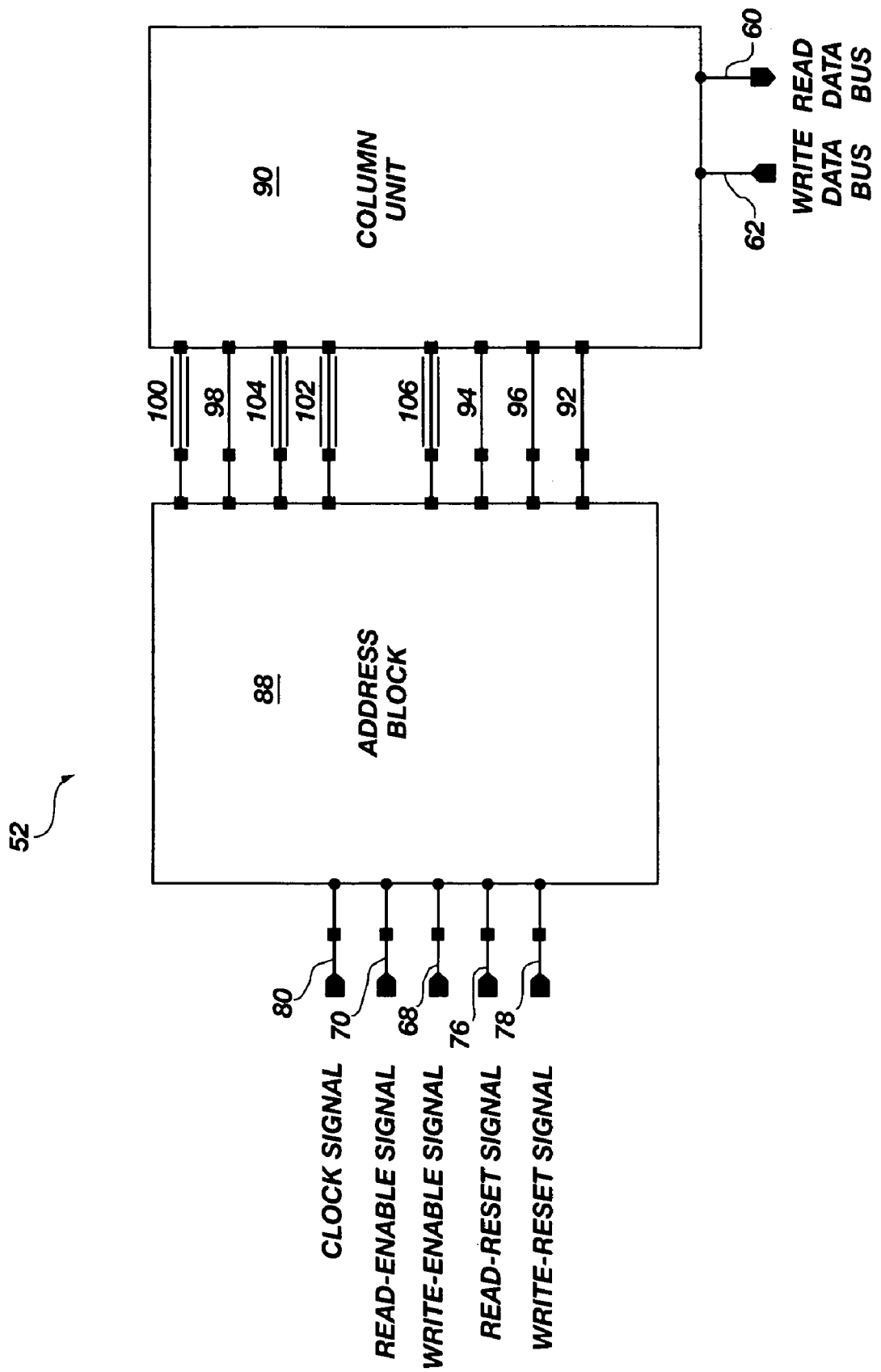
FIG. 6 is a simplified block diagram of the SAM device in accordance with an embodiment of the present invention.

In FIG. 6, the SAM device 52, in accordance with an embodiment of the present invention, may be partitioned into an address block 88 and ten column units 90. The ten column units 90 represent the memory array 54, the bank of 1:8 multiplexers 64 and the bank of 8:1 multiplexers 66, as seen in FIG. 3; the address block 88 generally corresponds to both the read-row pointer 72 and the write-row pointer 74 of FIG. 3. Continuing the previous example, the column units 90 receive input data on the 10-bit write-data bus 62 and transmit output data on the 10-bit read-data bus 60. The address block 88 receives the clock signal 80, the read-enable signal 70, the write-enable signal 68, the read-reset signal 76, and the write-reset signal 78. Several other data lines or traces connect the address block 88 and the ten column units 90, such as a read-clock signal 92, a write-clock signal 94, a write-pre-charge signal 96, a read-pre-charge signal 98, 161 read-word-line pointer signals 100, 161 write-word-line pointer signals 102, a three-bit read-column signal 104, and eight write-column signals 106.

Figure 7:
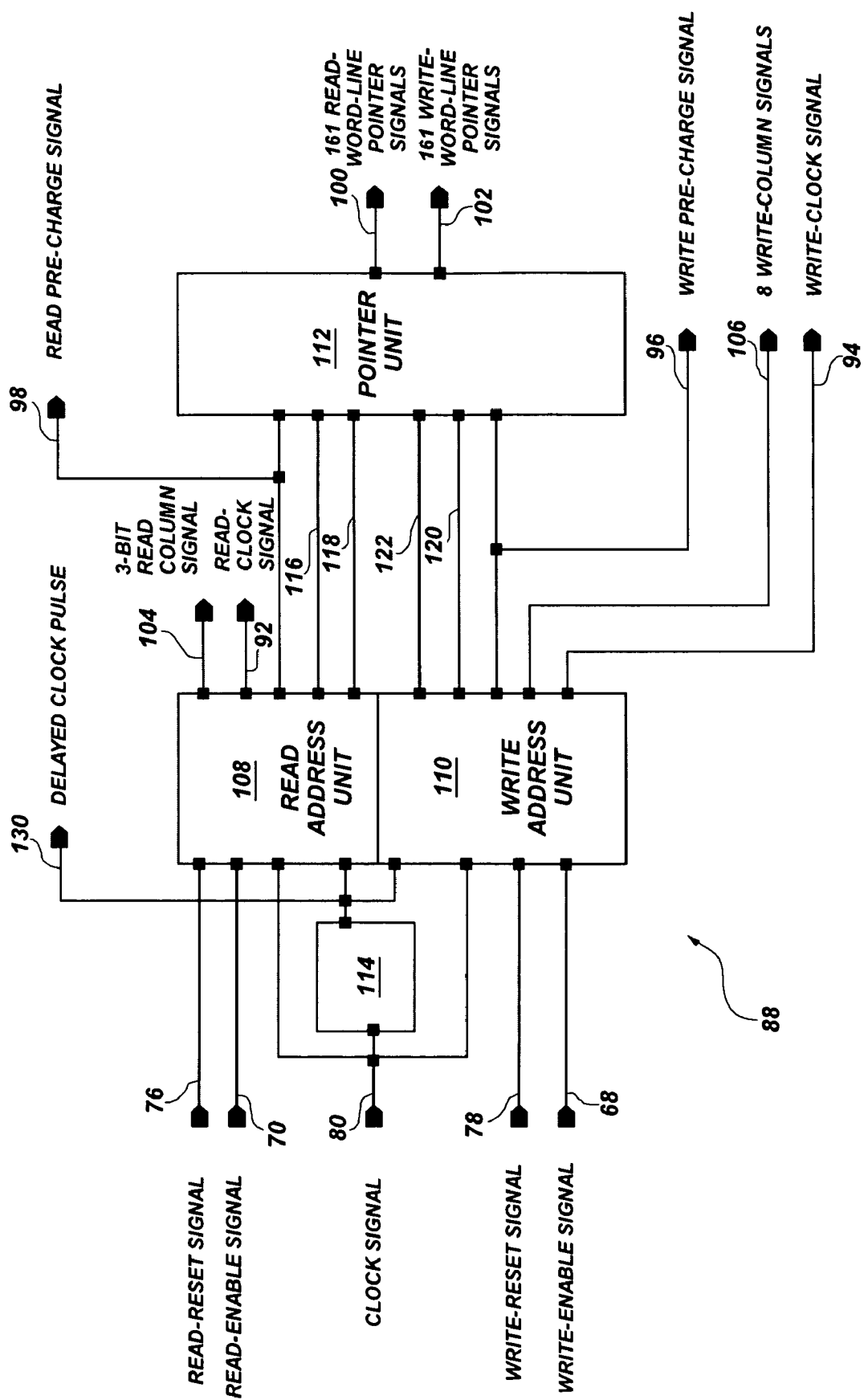
FIG. 7 is a simplified block diagram of an address block of a SAM device in accordance with an embodiment of the present invention.

FIG. 7 is a simplified block diagram of an address block 88 of the SAM device, in accordance with an embodiment of the present invention. The address block 88 includes a read address unit 108, a write address unit 110, and a pointer unit 112. Input signals such as the clock signal 80, the read-reset signal 76, the write-reset signal 78, the read-enable signal 70, and the write-enable signal 68 enter the respective address units 108 and 110. Before entering the read address unit 108, the clock signal passes through a clock delay circuit 114, to create the delayed clock pulse 130. The read address unit 108 outputs the three-bit read-column signal 104, the read-pre-charge signal 98, an inverted read-reset signal 116, the read-clock signal 92, and a highest-bit read-column signal 118, a signal representing the value of the highest bit of the 3-bit read-column signal 104. The write address unit 110 outputs the write-pre-charge signal 96, the eight write-column signals 106, the write-clock signal 94, an inverted write-reset signal 120, and the value of the eighth write-column signal 122. The read-pre-charge signal 98, the inverted read-reset signal 116, the highest-bit read-column signal 118, the write-pre-charge signal 96, the inverted write-reset signal 120, and the eighth write-column signal 122 are inputted into the pointer unit 112. The 161 read-word-line pointer signals 100 and the 161 write-word-line pointer signals 102 are outputted from the pointer unit 112.

Figure 8:
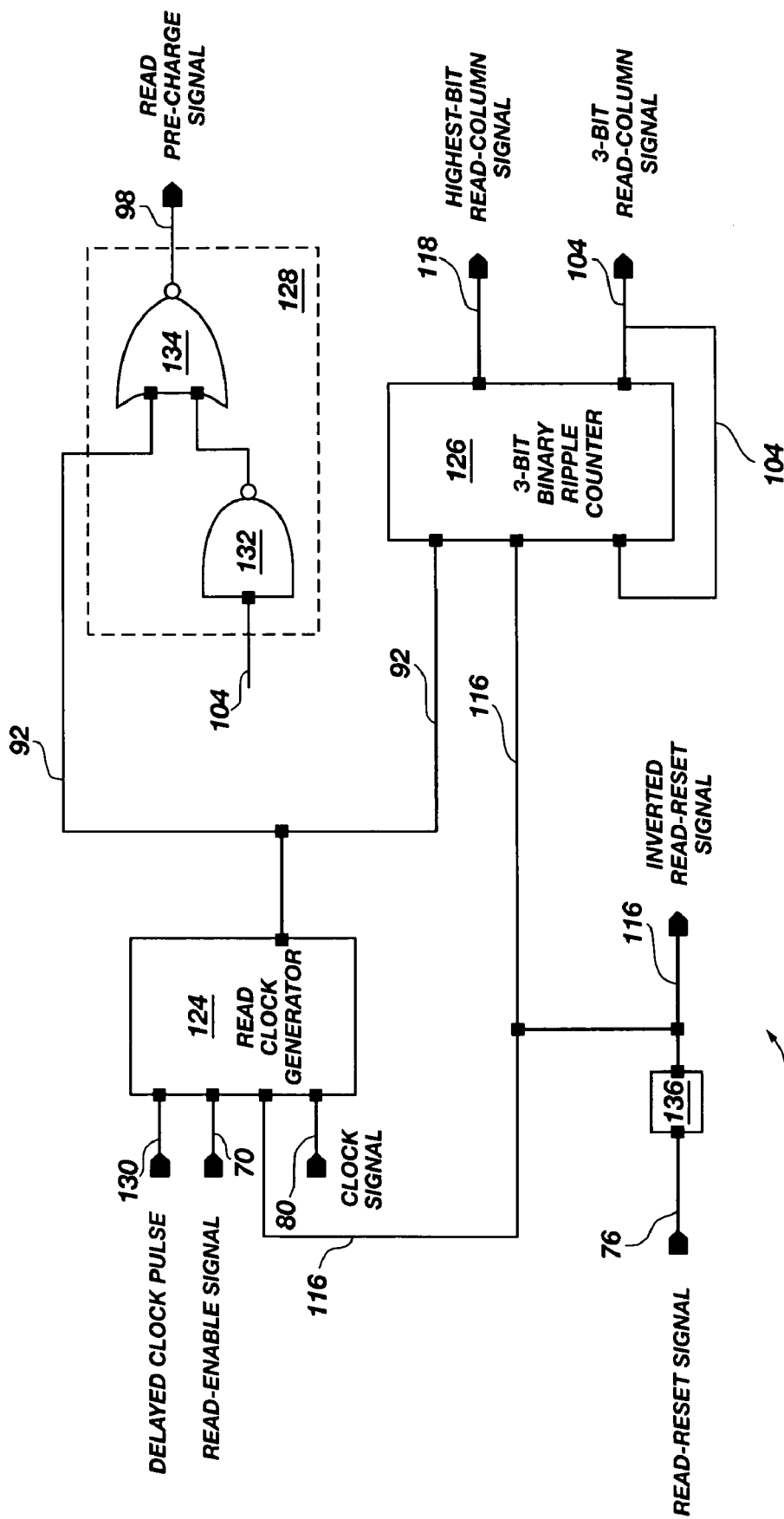
FIG. 8 is a simplified block diagram of a read address unit of an address block in accordance with an embodiment of the present invention.

FIG. 8 is a simplified block diagram of the read address unit 108 of the address block 88 (FIG. 7), in accordance with an embodiment of the present invention. The read address unit 108 includes a read-clock generator 124, a 3-bit binary ripple counter 126, and a read-pre-charge generator 128. The read-clock generator 124 utilizes an inverter, a NAND gate, and a D flip-flop to create a read-clock signal 92 for use by the read-pre-charge generator 128. The D flip-flop outputs the clocked status of the read-enable signal 70, utilizing both the clock signal 80 to time the D flip-flop and an inverted read-reset signal 116, derived from passing the read-reset signal 76 through inverter 136, to enable the D flip-flop, which signal is then inputted to the NAND gate. The NAND gate compares the read-enable signal 70 with the delayed clock pulse 130. If the read-enable signal 70 is active, the read-clock generator 124 outputs a clocked signal to both the 3-bit binary ripple counter 126 and the read-pre-charge generator 128. The 3-bit binary ripple counter 126 accepts as input the inverted read-reset signal 116 as well as its own output in the form of the 3-bit read-column signal 104. The 3-bit binary ripple counter 126 also outputs the highest-bit read-column signal 118. The read-clock signal 92 is used to time the switching operations of the 3-bit binary ripple counter 126. The ripple counter 126 increments every time the read-clock signal 92 cycles. The output of the binary ripple counter 126 is also combined with the read-clock signal 92 to generate the read-pre-charge signal 98 once every eighth enabled clock cycles. When all three counter bits of the 3-bit read-column signal 104 are high, the NAND gate 132 passes a low signal to the NOR gate 134. The NOR gate 134 compares the received low signal to the read-clock signal 92 and then momentarily outputs a read-pre-charge signal 98.

Figure 9:
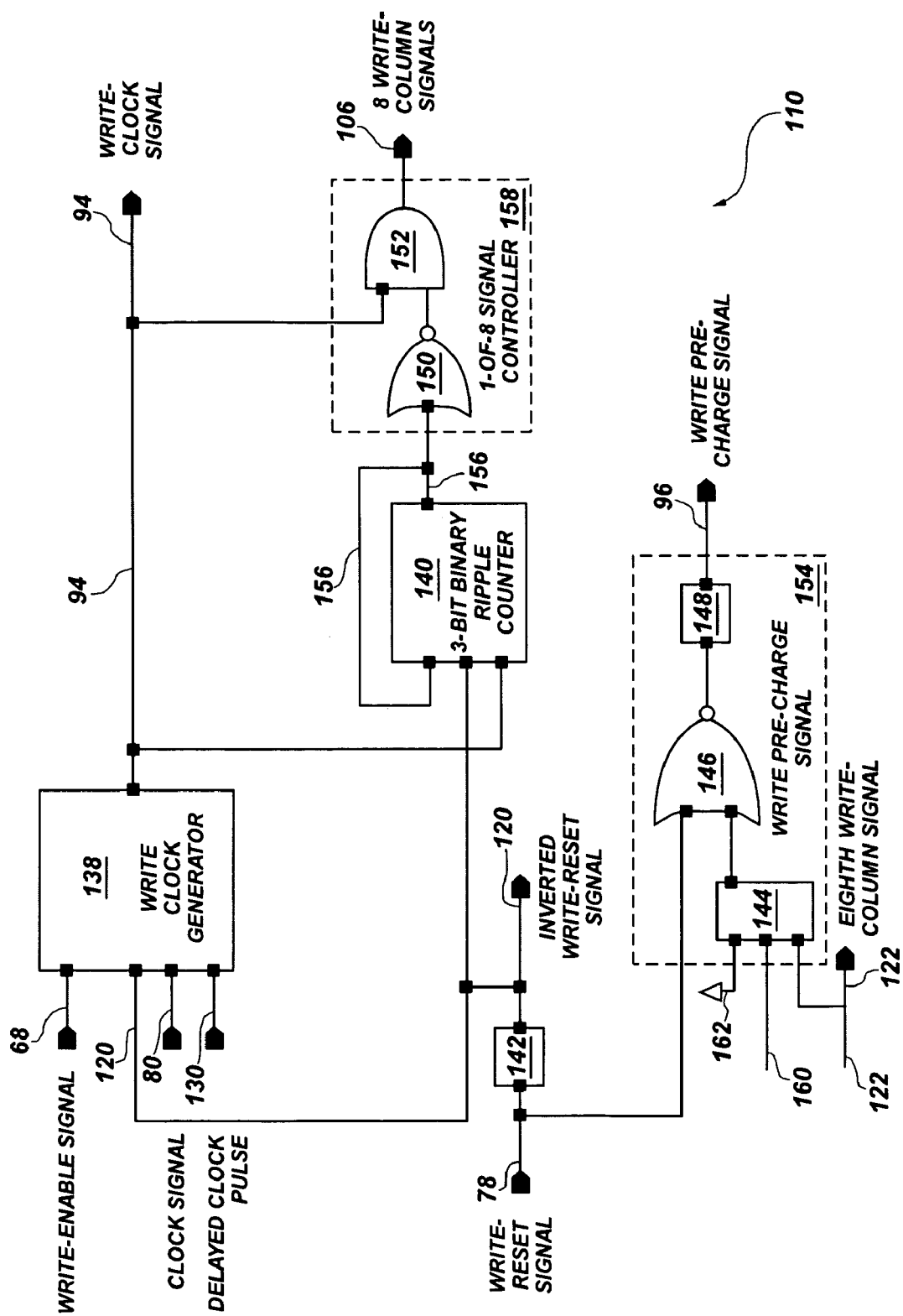
FIG. 9 is a simplified block diagram of a write address unit of an address block in accordance with an embodiment of the present invention.

FIG. 9 is a simplified block diagram of the write address unit 110 (FIG. 7) of the address block 88 (FIG. 6), in accordance with an embodiment of the current invention. The write address unit 110 consists of a write-clock generator 138, a 3-bit binary ripple counter 140, and a write-pre-charge generator 154. Similar to the read-clock generator 124 shown in FIG. 8, the write-clock generator 138 consists of a D flip-flop, an AND gate, and a buffer. The result is a delayed clock pulse, write-clock signal 94, that is used to time the writing operations of the device. The write-clock signal 94 is generated when the write-enable signal 68 is active. The write-clock generator 138 utilizes both the clock signal 80 to time the D flip-flop and the inverted write-reset signal 120 to enable the D flip-flop. The write-reset signal 78 is inverted by inverter 142 to create the inverted write-reset signal 120. The write-enable signal 68 is passed through the D flip-flop and then inputted to the AND gate, where it is compared with the delayed clock pulse 130. If the write-enable signal 68 is active, the AND gate passes the resultant write-clock signal 94. As in the read address unit 108 (FIG. 7), the write-clock signal 94 is used to time the 3-bit binary ripple counter 140. The output 156 of the 3-bit binary ripple counter 140 feeds through a NOR gate 150 and a clocked AND gate 152 to create a one-of-eight signal controller 158 that outputs the eight write-column signals 106 used to select the appropriate data from the write-data bus 62 (FIG. 6). The AND gate 152 is clocked by the write-clock signal 94. The generation of the write-pre-charge signal 96 is also shown in FIG. 9. The write-pre-charge signal 96 is initiated by the eighth or last write-column signal 122 de-asserting, and it is terminated by the first write-column signal 160 asserting. Specifically, the eighth write-column signal 122, originating from the one-of-eight signal controller 158, clocks a D flip-flop 144. The first write-column signal 160 enables the D flip-flop 144. The result is the momentary passing of a digitally high value 162 through the D flip-flop 144 and into a NOR gate 146, where the signal is compared with the write-reset signal 78. The output of the NOR gate 146 is inverted by inverter 148, resulting in the generation of the write-pre-charge signal 96. Thus, the write-pre-charge signal 96 occurs once for every eighth enabled write-clock signal 94 cycle.

Figure 10:
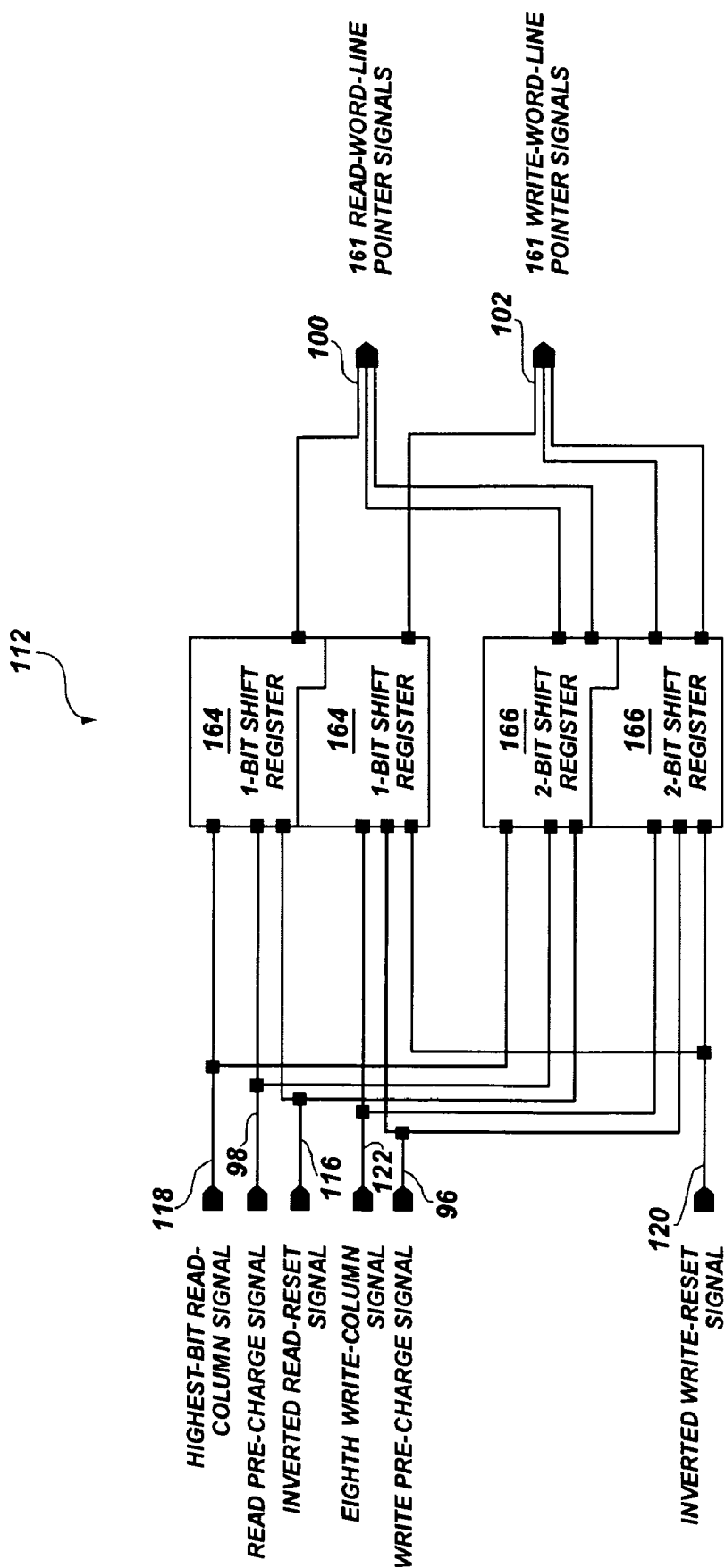
FIG. 10 is a simplified block diagram of a pointer unit of an address block in accordance with an embodiment of the present invention.

FIG. 10 is a simplified block diagram of the pointer unit 112 (FIG. 7) of the address block 88, in accordance with an embodiment of the present invention. The pointer unit 112 includes two types of shift registers: a set of 1-bit shift registers 164, and 80 sets of 2-bit shift registers 166. In operation, each register initializes to the last bit set (in this example, the bit set indicating row160) while all other bits are reset. The output of the 1-bit shift registers 164 and the 2-bit shift registers 166 acts as a walking pointer, able to select either the read row or the write row of the memory array 54 (FIG. 3). The read-row pointers 72 (FIG. 3) are clocked by the highest-bit read-column signal 118 from the read address unit 108 (FIG. 8), thus providing a clocking edge for every eighth read-clock signal 92 (FIG. 8) pulse. The write-row pointers 74 (FIG. 3) are also clocked by the eighth write-column signal 122 (FIG. 9) from the write address unit 110 (FIG. 9), once again providing a clocking edge for every eighth write-clock signal 94 (FIG. 9) pulse. The pointer unit 112 thus increments the addressed row for each eighth input clock signal 80 (FIG. 3) cycle. The pointer unit 112 outputs the 161 write-word-line pointer signals 102 and the 161 read-word-line pointer signals 100.

The 2-bit shift registers 166 of the current example are gated by either a read or a write select in the form of a read-pre-charge signal 98 or a write-pre-charge signal 96, respectively. The pre-charge signals 98 and 96 act to ensure that no row address is active during pre-charge. For each write-row pointer 74 (FIG. 3) and for each read-row pointer 72 (FIG. 3), there exist eighty such sets. Upon reset by the inverted read-reset signal 116 or the inverted write-reset signal 120, all of the 2-bit shift registers 166 are reset to "zero."

The 1-bit shift registers 164 of the current example work primarily the same as the 2-bit shift registers 166, but upon reset, the 1-bit shift registers 164 are reset to "one." Hence, when the entire SAM device 52 (FIG. 3) is reset, the write-row pointers 74 (FIG. 3) and read-row pointers 72 (FIG. 3) are reset to point to the last row in the memory array 54 (FIG. 3), row160. The output from row160 is connected as the input of row0. Therefore, upon receipt of a read or write command, the write-row pointers 74 and read-row pointers 72 are rolled over to row0.

Figure 11:
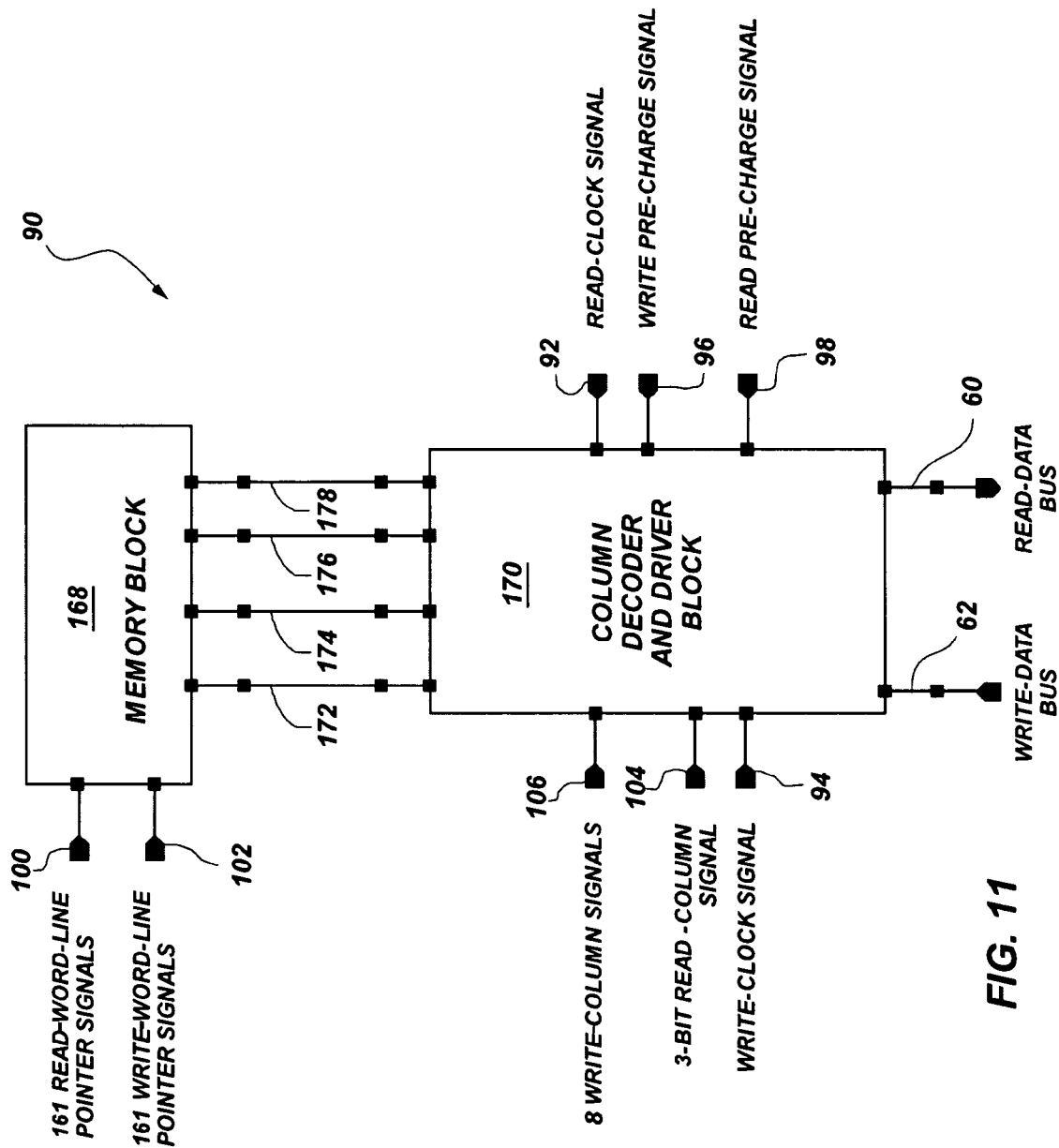
FIG. 11 is a simplified block diagram of a column unit of a SAM device in accordance with an embodiment of the present invention.

FIG. 11 is a simplified block diagram of a column unit 90 of the SAM device 52 (FIG. 3) depicting, in the current exemplary embodiment, one of ten such column units within the SAM device 52. Column unit 90 consists of 161 memory blocks 168, and one column decoder and driver block 170. Each memory block 168 may be configured as an eight-bit serial byte of bit cells and may thus store eight bits of the memory array 54 (FIG. 3). 161 copies of the memory block 168 represent an entire 8-bit column unit 90 of the memory array 54. As shown in FIG. 11, the column decoder and driver block 170 receives as inputs from the address block 88 (FIG. 7) the eight write-column signals 106, the 3-bit read-column signal 104, the write-clock signal 94, the read-clock signal 92, the write-pre-charge signal 96 and the read-pre-charge signal 98. The column decoder and driver block 170 also receives data from the write-data bus 62 and transmits data to the read-data bus 60. Each of the 161 8-bit memory blocks 168 receive as inputs from the pointer unit 112 (FIG. 10) the 161 read-word-line pointer signals 100 and the 161 write-word-line pointer signals 102. The memory blocks 168 and the column decoder and driver block 170 are connected to each other via eight write bit-lines 172, eight read bit-lines 176, eight write bit-line complements 174 and eight read bit-line complements 178.

Figure 12:
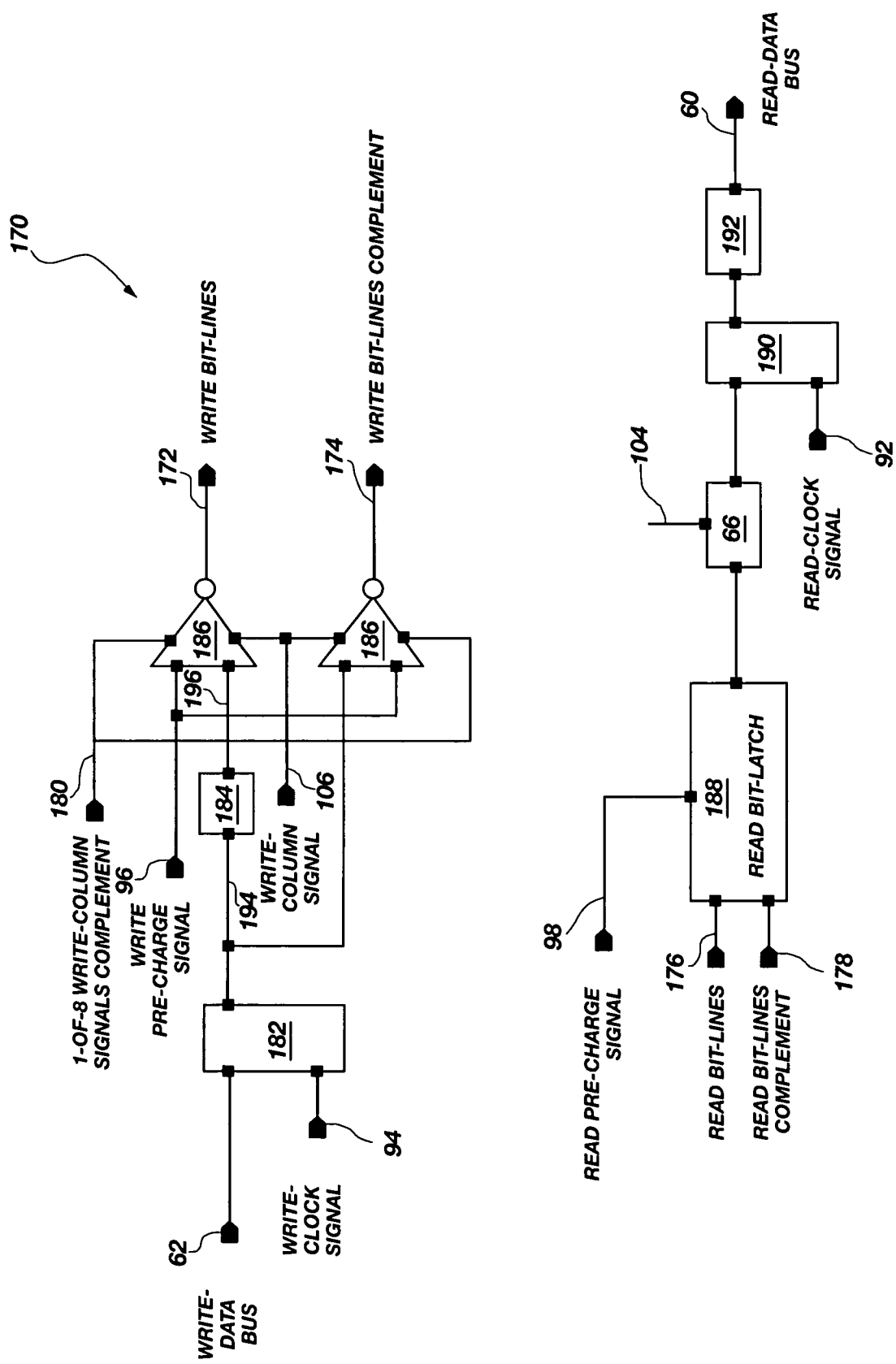
FIG. 12 is a simplified block diagram of a column decoder and driver block of a column unit in accordance with an embodiment of the present invention.

FIG. 12 is a simplified block diagram of a column decoder and driver block 170 of the column unit 90 (FIG. 11), in accordance with an embodiment of the present invention. Data from the write-data bus 62 is registered as it passes through a D flip-flop 182 clocked by the write-clock signal 94. The registered write-data 194 and the registered write-data complement 196 are then fanned out to eight sets of tri-state inverters 186. The appropriate tri-state inverter 186 is selected by the one-of-eight write-column signals 106 (or a one-of-eight write-column signals complement 180) generated by the write address unit 110 (FIG. 9). The tri-state inverters 186, then, drive the appropriate registered write-data 194 and registered write-data complement 196 onto the respective write bit-lines 172 and write bit-line complements 174, as determined by both the write-column signal 106 and the write-column signal complement 180. The tri-state inverters 186 also have an input from the write-pre-charge signal 96, generated by the write address unit 110 (FIG. 9), which has the effect of pre-charging the write bit-lines 172 and the write bit-line complements 174 high prior to any write operation. After the write-pre-charge signal 96 pulse, each tri-state inverter 186 may be enabled to sequentially pass the registered write-data 194 onto the write bit-lines 172 and the write bit-line complements 174 and to the memory array 54 (FIG. 3).

FIG. 12 also depicts the path of data flow from the read bit-lines 176 and the read bit-line complements 178 to the read-data bus 60. Data is read from the read bit-lines 176 and the read bit-line complements 178 through eight read-pre-charge signal 98 enabled read-bit latches 188, which are basically latched, cross-coupled NAND gates. The output of each of the eight read-bit latches 188 is assimilated by the 3-bit read-column signal 104 controlled 8:1 mux 66. The output of the 8:1 mux 66 is passed through a D flip-flop 190 gated by the read-clock signal 92. The final output passes through a buffer 192 before entering the read-data bus 60.

Figure 13:
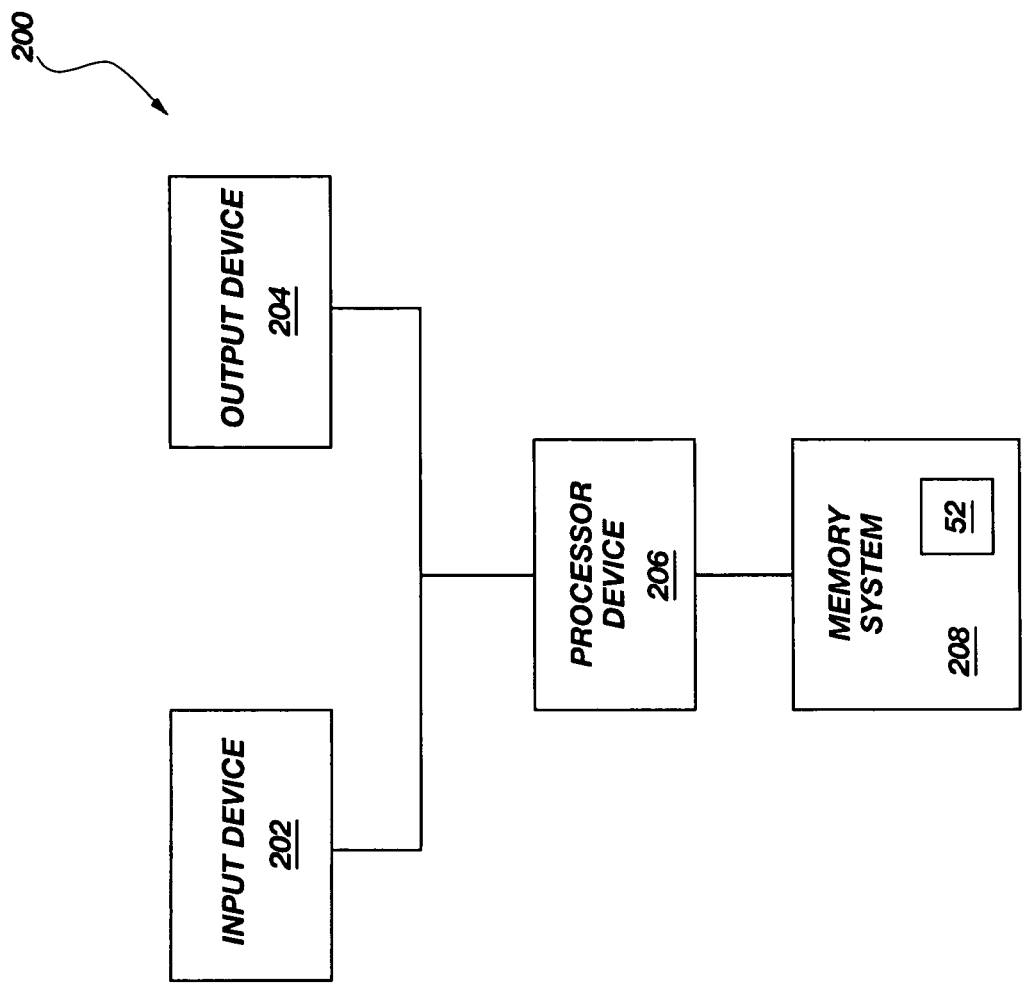
FIG. 13 is a simplified block diagram of an electronic system incorporating the SAM device of FIG. 3, in accordance with an embodiment of the present invention.

FIG. 13 is a block diagram of an electronic system 200 incorporating the SAM device 52 of FIG. 3, in accordance with an embodiment of the present invention. An electronic system 200 is depicted, which includes an input device 202, an output device 204, a processor device 206 and a memory system 208 incorporating the SAM device 52 (FIG. 3). Of course, it will be understood that the SAM device 52 (FIG. 3) may be incorporated into any one of the input, output, and processor devices 202, 204 and 206 too.

Figure 14:
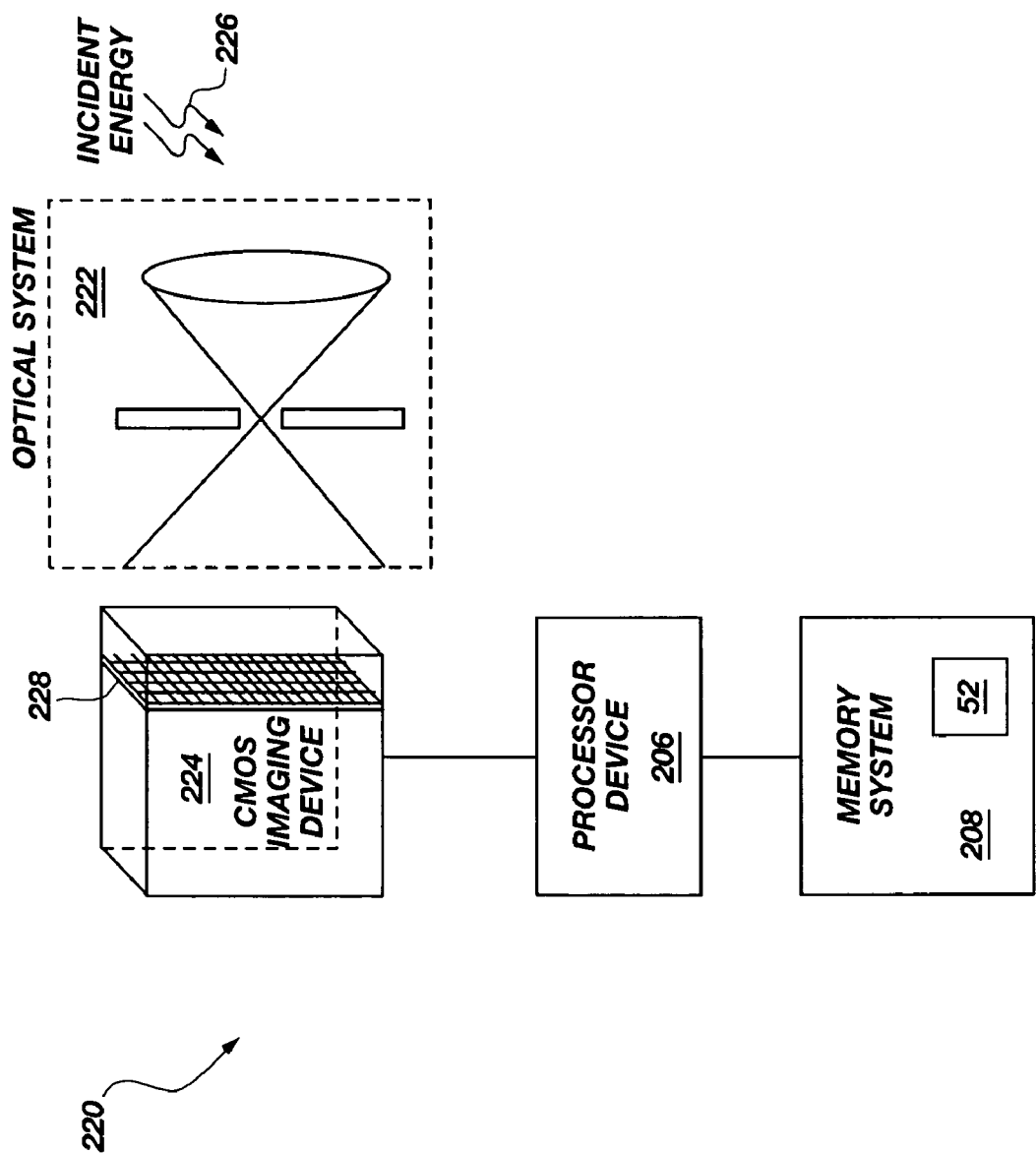
FIG. 14 is a block diagram of an imaging system incorporating the SAM device of FIG. 3, in accordance with an embodiment of the present invention.

FIG. 14 is a block diagram of an imaging system 220, in accordance with an embodiment of the present invention. The imaging system 220 is a specific example of the electronic system 200 (FIG. 13). The imaging system 220 receives as input incident energy 226 that is directed by an optical system 222 to a complementary metal oxide semiconductor ("CMOS"), a charge-coupled device ("CCD") or other imaging device 224. The CMOS, CCD or other imaging device 224 includes an image sensor 228 that receives the directed input incident energy 226. The image sensor 228 is a two-dimensional array of pixels. Pixel data captured by the image sensor 228 is then transferred via a processor device 206 to the SAM device 52 of FIG. 3 located within a memory system 208. Although FIG. 14 depicts the SAM device 52 (FIG. 3) located within the memory system 208, it will be understood that the SAM device 52 (FIG. 3) may be incorporated into any one of the CMOS, CCD or other imaging device 224 and the processor device 206.

Upon transfer to the SAM device 52 (FIG. 3), pixel data may be stored in the memory array 54 (FIG. 3) through an initial row selection process, a pre-charging of the write bit-lines 172 (FIG. 11) and the write bit-line complements 174 (FIG. 11), and the posting of the pixel data by the column decoder and driver block 170 (FIG. 11) to the specific memory cells 56 (FIG. 3). In the current example, pixel data would be transferred from the image sensor 228 to the memory array 54 (FIG. 3) in eight-word or eight-pixel increments, each pixel encoded in a ten-bit word. If the image sensor 228 includes a line-width of 1288 pixels, then one row of pixel data could be stored on the memory array 54 (FIG. 3) of the SAM device 52 (FIG. 3), eight pixels at a time. The first eight pixels would be written to the first row of the memory array 54 (FIG. 3), meaning that row 0 would be selected by the write address unit 110 (FIG. 7) and pointer unit 112 (FIG. 7). As pixel data continued to be transferred to the memory array 54 (FIG. 3), the pointer unit 112 (FIG. 7) would increment once each eight-word write operation. Similarly, the write bit-lines 172 (FIG. 11) and the write bit-line complements 174 (FIG. 11) would only be pre-charged once prior to each eight-word write operation. Each row of pixel data would be written to a corresponding SAM device 52 (FIG. 3). Read operations would occur in a substantially similar manner.

Figure 15:
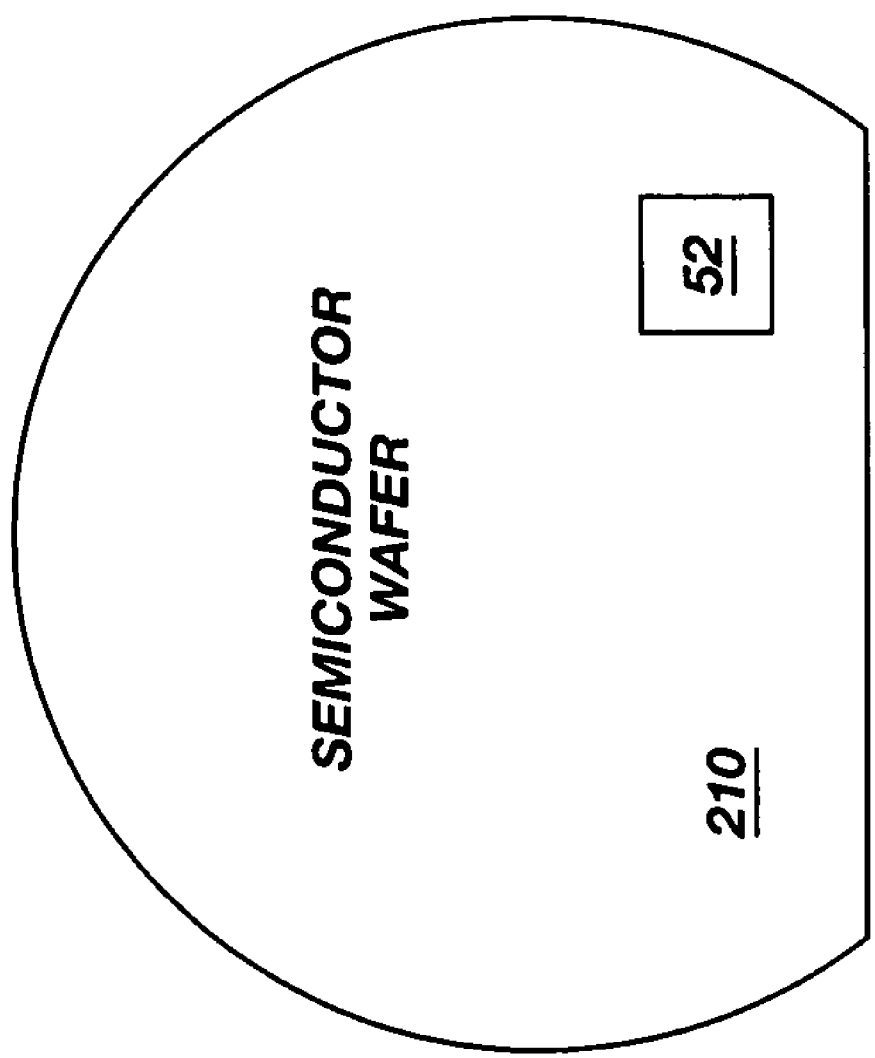
FIG. 15 is a diagram of a semiconductor wafer on which the SAM of FIG. 3 is fabricated, in accordance with an embodiment of the present invention.

FIG. 15 is a diagram of a semiconductor wafer 210 on which the SAM device 52 of FIG. 3 is fabricated, in accordance with an embodiment of the present invention. Of course, it should be understood that the SAM device 52 may be fabricated on a bulk semiconductor substrate other than a wafer, such as a Silicon-on-Insulator ("SOI") substrate, a Silicon-on-Glass ("SOG") substrate, and a Silicon-on-Sapphire ("SOS") substrate.

Although an 8 by 161 memory array has been described herein, it is envisioned that other memory array topologies with various dimensions may rely upon the same or similar technologies that enable the present invention to reduce pre-charge frequency and heat emissions.

The foregoing detailed description of the present invention is provided for purposes of illustration and is not intended to be exhaustive or to limit the invention to the precise embodiment disclosed. Accordingly, the scope of the present invention is defined by the following claims.

What is claimed is:

1. A method of storing image data in a sequential memory, comprising:
   activating a selected row of memory cells in the sequential memory;
   generating a pre-charge signal once for a plurality of bit-lines for the selected row; and
   sequentially transferring a plurality of bytes of the image data along the selected row of memory cells, wherein generating the pre-charge signal comprises using a write-pre-charge signal prior to sequentially transferring the plurality of bytes of the image data to the memory cells along the selected row.

2. The method of claim 1, wherein sequentially transferring the plurality of bytes comprises multiplexing the plurality of bytes of the image data across the selected row in the sequential memory.

3. The method of claim 1, wherein activating the selected row comprises using an address unit row pointer to activate the selected row prior to the pre-charging of the plurality of bit-lines.

4. The method of claim 1, wherein sequentially transferring the plurality of bytes comprises using a signal decoder and driver unit configured to transfer one of the plurality of bytes into the selected row of the sequential memory once per each pre-charging of the plurality of bit-lines.

5. The method of claim 1, wherein sequentially transferring the plurality of bytes comprises generating a write-column signal to direct a byte of the plurality of bytes to selected ones of the memory cells within the selected row.

6. A method of storing image data from an imaging device, comprising:
   receiving a sequential plurality of bytes of image data;
   simultaneously pre-charging bit-lines on a selected row of memory cells; and
   writing the sequential plurality of bytes of image data across the selected row of memory cells, wherein simultaneously pre-charging the bit-lines on the selected row of memory cells comprises using a write-pre-charge signal prior to writing the sequential plurality of bytes of the image data across the selected row of memory cells.

7. The method of claim 6, wherein writing of the sequential plurality of bytes occurs before a subsequent pre-charging of bit-lines of another selected row.

8. The method of claim 6, wherein writing the sequential plurality of bytes comprises multiplexing the sequential plurality of bytes of the image data across the selected row of memory cells.

9. The method of claim 6, wherein when the sequential plurality of bytes of imaging data exceeds a capacity of the selected row of memory cells, the method further comprising:
   repeating the simultaneous pre-charging of the bit-lines for a different selected row of memory cells; and
   writing at least a portion of remaining ones of the sequential plurality of bytes of the image data across the different selected row of memory cells.

* * * * *